United States Patent
Schulze et al.

(10) Patent No.: US 10,026,816 B2
(45) Date of Patent: Jul. 17, 2018

(54) SEMICONDUCTOR WAFER AND MANUFACTURING METHOD

(71) Applicant: Infineon Technologies AG, Neubiberg (DE)

(72) Inventors: Hans-Joachim Schulze, Taufkirchen (DE); Helmut Oefner, Zorneding (DE)

(73) Assignee: Infineon Technologies AG, Neubiberg (DE)

( * ) Notice: Subject to any disclaimer, the term of this patent is extended or adjusted under 35 U.S.C. 154(b) by 269 days.

(21) Appl. No.: 14/672,783

(22) Filed: Mar. 30, 2015

(65) Prior Publication Data

US 2016/0293712 A1    Oct. 6, 2016

(51) Int. Cl.
| | |
|---|---|
| H01L 29/36 | (2006.01) |
| H01L 21/223 | (2006.01) |
| C30B 33/00 | (2006.01) |
| C30B 29/06 | (2006.01) |
| C30B 31/06 | (2006.01) |
| H01L 21/02 | (2006.01) |

(52) U.S. Cl.
CPC .............. *H01L 29/36* (2013.01); *C30B 29/06* (2013.01); *C30B 31/06* (2013.01); *C30B 33/00* (2013.01); *C30B 33/005* (2013.01); *H01L 21/02005* (2013.01)

(58) Field of Classification Search
CPC ... H01L 29/36; H01L 21/3221; H01L 29/167; H01L 29/16; H01L 29/32; H01L 29/7869; H01L 21/02005
USPC .................................... 257/655, 330, 77, 296
See application file for complete search history.

(56) References Cited

U.S. PATENT DOCUMENTS

| | | | | |
|---|---|---|---|---|
| 5,611,855 A | * | 3/1997 | Wijaranakula | .......... C30B 29/06 117/2 |
| 6,802,899 B1 | * | 10/2004 | Tamatsuka | .............. C30B 29/06 117/13 |
| 2002/0179003 A1 | * | 12/2002 | Iida | ........................ C30B 15/203 117/19 |
| 2004/0040491 A1 | * | 3/2004 | Murakami | ............ C30B 15/203 117/20 |
| 2007/0252239 A1 | * | 11/2007 | Maeda | ................ H01L 21/3225 257/607 |

(Continued)

OTHER PUBLICATIONS

Shimura, Fumio et al., "Oxygen in Silicon", vol. 42 of Semiconductors and Semimetals, Academic Press, 1994, pp. 226-228, 499-504.

*Primary Examiner* — Moazzam Hossain
(74) *Attorney, Agent, or Firm* — Murphy, Bilak & Homiller, PLLC (57) ABSTRACT

A semiconductor wafer includes first and second main surfaces opposite to each other along a vertical direction, and a side surface encircling the semiconductor wafer. A lateral distance perpendicular to the vertical direction between the side surface and a center of the semiconductor wafer includes first and second parts. The first part extends from the side surface to the second part and the second part extends from the first part to the center. An average concentration of at least one of nitrogen and oxygen in the first part is greater than $5 \times 10^{14}$ cm$^{-3}$ and exceeds an average concentration of the at least one of nitrogen and oxygen in the second part by more than 20% of the average concentration of the at least one of nitrogen and oxygen in the second part.

14 Claims, 3 Drawing Sheets

(56) References Cited

U.S. PATENT DOCUMENTS

2012/0306052 A1* 12/2012 Ono .................... H01L 21/3225
　　　　　　　　　　　　　　　　　　　　　　　257/607
2014/0273480 A1*  9/2014 Previtali ........... H01L 21/02005
　　　　　　　　　　　　　　　　　　　　　　　438/703

* cited by examiner

SEMICONDUCTOR WAFER AND MANUFACTURING METHOD

BACKGROUND

Semiconductor device manufacturing requires various processes for a semiconductor body including material deposition, removal, patterning, and modification of electrical properties of the semiconductor body. Some of these processes are carried out at high temperatures, for example epitaxial growth and annealing. Processing the semiconductor body at high temperatures generates thermal gradients within the semiconductor body leading to mechanical stress. The semiconductor body may react to thermal stress exceeding a certain threshold value by altering its crystal structure to release the stress, for example by shifting crystal planes relative to each other along preferred crystal lattice planes. This leads to a local disruption of the lattice accompanied by crystal defects such as slip lines. Slip lines may be detrimental to the performance of electrical devices, for example due to an increase of leakage currents caused by the slip lines. With increasing wafer size the problem of crystal defect generation caused by wafer processing such as front-end-of-line (FEOL) processing becomes even more challenging.

It is desirable to increase the mechanical stability of a semiconductor wafer and to provide a method of manufacturing a semiconductor wafer having improved mechanical stability.

SUMMARY

The present disclosure relates to a semiconductor wafer having first and second main surfaces opposite to each other along a vertical direction. The semiconductor wafer further includes a side surface encircling the semiconductor wafer. A lateral distance, perpendicular to the vertical direction, between the side surface and a center of the semiconductor wafer includes first and second parts. The first part extends from the side surface to the second part and the second part extends from the first part to the center. An average concentration of at least one of nitrogen and oxygen in the first part is greater than $5\times10^{14}$ cm$^{-3}$ and exceeds an average concentration of the at least one of nitrogen and oxygen in the second part by more than 20% of the average concentration of the at least one of nitrogen and oxygen in the second part.

The present disclosure also relates to a method of forming a semiconductor wafer. The method comprises providing a block of semiconductor material, the block of semiconductor material comprising opposite first and second surfaces and a side surface encircling the semiconductor block. The method further comprises introducing at least one of nitrogen and oxygen into the semiconductor block through the side surface, wherein a lateral distance between the side surface and a center of the semiconductor block includes first and second parts. The first part extends from the side surface to the second part and the second part extends from the first part to the center. An average concentration of at least one of nitrogen and oxygen in the first part is greater than $5\times10^{14}$ cm$^{-3}$ and exceeds an average concentration of the at least one of nitrogen and oxygen in the second part by more than 20% of the average concentration of the at least one of nitrogen and oxygen in the second part. The method further comprises slicing the semiconductor block into semiconductor wafers.

The present disclosure also relates to another method of forming a semiconductor wafer. The method comprises slicing a semiconductor wafer from a semiconductor block. A diffusion barrier is formed on at least one of opposite first and second main surfaces of the semiconductor wafer. The diffusion barrier covers a central part of the semiconductor wafer on the at least one of the first and second surfaces leaving an edge part of the semiconductor wafer at the first and second surfaces uncovered. At least one of nitrogen and oxygen is introduced into the semiconductor wafer through an uncovered part of the semiconductor wafer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "$n^-$" means a doping concentration that is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

Figure 1A:
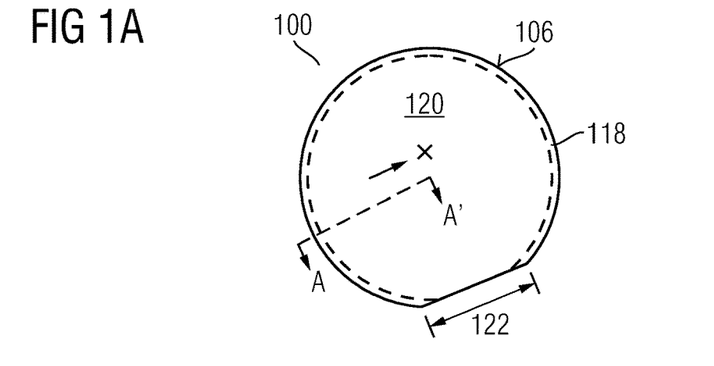
FIG. 1A is a schematic top view of an embodiment of a semiconductor wafer.
Figure 1B:
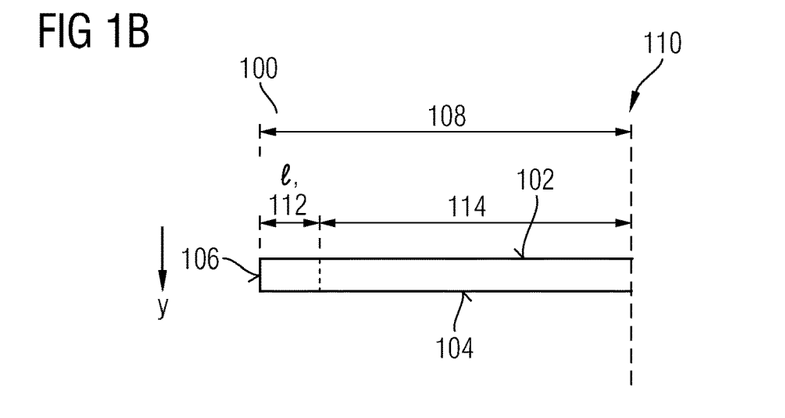
FIG. 1B is a cross-sectional view of the semiconductor wafer of FIG. 1A along cut line A-A'.
Figure 1C:
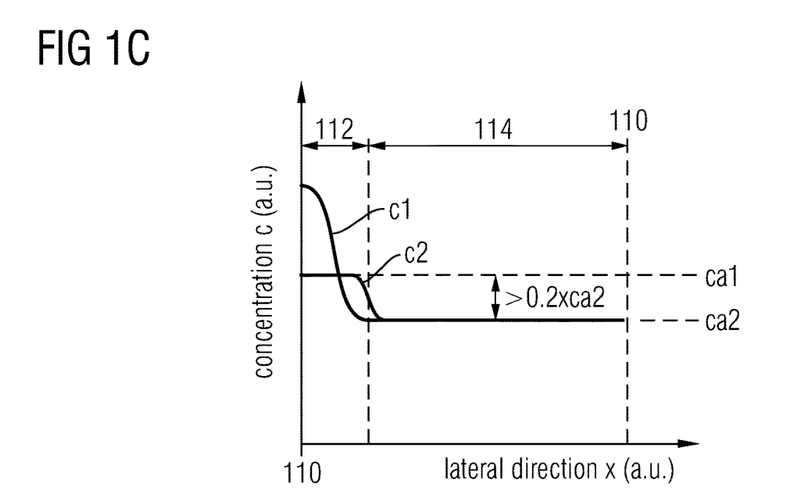
FIG. 1C is a graph illustrating embodiments of profiles and average concentrations of at least one of oxygen and nitrogen from a side surface of the semiconductor wafer of FIG. 1A to a center of the semiconductor wafer.

An embodiment of a semiconductor wafer 100 is illustrated in FIGS. 1A to 1C. FIG. 1A refers to a schematic top view of the semiconductor wafer 100, FIG. 1B refers to a schematic cross-sectional view along cut line A-A' of FIG. 1A, and FIG. 1C refers to graph illustrating a concentration c of at least one of nitrogen (N) and oxygen (O) along the cut line A-A' of FIG. 1A.

The semiconductor wafer 100 includes first and second main surfaces 102, 104 opposite to each other along a vertical direction y. A side surface 106 encircles the semiconductor wafer 100. A lateral distance 108 perpendicular to the vertical direction y between the side surface 106 and a center 110 of the semiconductor wafer 100 includes first and second parts 112, 114. The first part 112 extends from the side surface 106 to the second part 114. The second part extends from the first part 112 to the center 110. An average concentration ca1 of at least one of nitrogen and oxygen in the first part 112 is greater than $5\times10^{14}$ cm$^{-3}$ and exceeds an average concentration ca2 of the at least one of nitrogen and oxygen in the second part 114 by more than 20% of the average concentration ca2 of the at least one of nitrogen and oxygen in the second part 114. In some embodiments, the average concentration ca1 of oxygen in the first part 112 is greater than $3 \times 10^{17}$ cm$^{-3}$, or greater than $5 \times 10^{17}$ cm$^{-3}$, or even greater than $8 \times 10^{17}$ cm$^{-3}$. In some embodiments, the average concentration ca1 of nitrogen in the first part 112 is greater than $5 \times 10^{14}$ cm$^{-3}$, or greater than $1 \times 10^{15}$ cm$^{-3}$, or even greater than $3 \times 10^{15}$ cm$^{-3}$. Exemplary profiles of concentration c of the at least one of nitrogen and oxygen in the first and second parts 112, 114 are schematically illustrated by curves c1, c2 in FIG. 1C. The curve c1 represents one embodiment of a concentration profile where the at least one of nitrogen and oxygen decreases along more than 80% of a lateral dimension of the first part 112 starting from the side surface 106. A profile corresponding to curve c1 and similar profiles may be formed by diffusion of the at least one of nitrogen and oxygen through the side surface 106 of the semiconductor wafer 100. The curve c2 represents one embodiment of a concentration profile where the at least one of nitrogen and oxygen, along a lateral distance x, is a step-concentration profile including a decrease of concentration at an interface between the first part 112 and the second part 114. A profile corresponding to the curve c2 and similar profiles may be formed by ion implantation and/or diffusion of the at least one of oxygen and nitrogen through one or both of the first and second main surfaces 102, 104 using an ion implantation and/or diffusion mask covering the semiconductor wafer 100 in the second part 114 and exposing the semiconductor wafer 100 in the first part 112.

In some embodiments, the semiconductor wafer 100 is a Czochralski (CZ) silicon wafer, e.g. formed by the standard CZ method or by the magnetic CZ (MCZ) method or by the continuous CZ (CCZ) method. In some other embodiments, the semiconductor wafer 100 is a float zone (FZ) silicon wafer. Optionally an epitaxial layer may be deposited on at least one of the first and second main surfaces 102, 104. In some embodiment, the thickness of this epitaxial layer ranges between 1 μm and 200 μm.

In some embodiments, a lateral dimension l of the first part 112 between the side surface 106 and the second part 114 ranges between 10 μm and 1 cm, or between 20 μm and 5 mm.

In some embodiments, an average concentration of the at least one of nitrogen and oxygen in an edge part 118 of the semiconductor wafer 100 exceeds an average concentration of the at least one of nitrogen and oxygen in a central part 120 of the semiconductor wafer 100 encircled by the edge part 118 by more than 20%, or even more than 50%, or even more than a factor of 2 of the average concentration of the at least one of nitrogen and oxygen in the central part 120. The relation between the average concentration of the at least one of nitrogen and oxygen in the central and edge parts 120, 118 may not be valid with respect to a part of the side surface 106 covering a notch or flat due to removal or partial removal of the edge part 118 around the notch or flat. In the embodiment illustrated in FIG. 1A, a flat 122 is schematically illustrated. In some other embodiments, the semiconductor wafer 100 may include, in addition or alternatively, a notch or any other kind of mark indicating crystallographic planes of the semiconductor wafer 100.

In some embodiments, the semiconductor wafer 100 is a 12-inch semiconductor wafer or larger.

In some embodiments, the average concentration of the at least one of nitrogen and oxygen is more than ten times, or more hundred times greater in the first part 112 than in the second part 114. In some embodiments, the at least one of nitrogen and oxygen is nitrogen. In some other embodiments, the at least one of nitrogen and oxygen is oxygen. In some other embodiments, the at least one of nitrogen and oxygen corresponds to nitrogen and oxygen.

Presence of oxygen in required quantities for increasing a stress limit at which slip line formation in silicon occurs leads to formation of thermal donors in silicon which is detrimental for lightly doped silicon wafers used as base material for insulated gate bipolar transistors (IGBTs), for example. Also for the case of epitaxial layer(s) formed on CZ or MCZ wafers, the required quantities of oxygen may be critical due to out-diffusion of oxygen during formation of the epitaxial layer(s) such as deposition or growth of the epitaxial layer(s) and subsequent high-temperature processing. Since nitrogen interacts with hydrogen in silicon and with defects generated by proton implantation, for example when manufacturing field stop zones by proton implantation, undesired electrically active defects may be generated.

Embodiments described herein provide a semiconductor wafer having an improved mechanical stability. In embodiments described herein, the first part 112 acting as a seeding area for slip lines progressing towards the center 110 of the semiconductor wafer is strengthened in the mechanical stability by adding at least one of nitrogen and oxygen. The first part 112 may constitute or be part of an edge inclusion area along a circumference of the semiconductor wafer 100 in which no semiconductor dies are manufactured. Since a concentration of the at least one of nitrogen and oxygen in the second part 114 of the semiconductor wafer 100 is smaller than in the first part 112, undesirable defect generation caused by the at least one of oxygen and nitrogen in the first part 112 may be counteracted and/or avoided.

Figure 2:
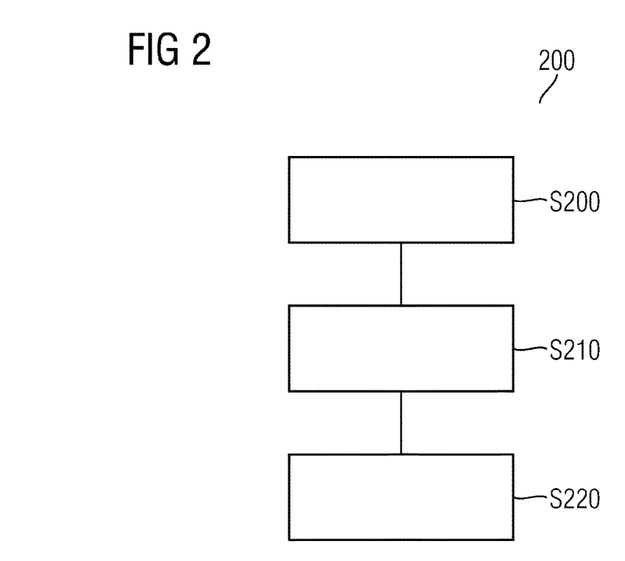
FIG. 2 is a flow diagram of an embodiment of a method of manufacturing a semiconductor wafer.

FIG. 2 is a flow diagram of an embodiment of a method 200 of manufacturing a semiconductor wafer.

It will be appreciated that while method 200 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or faces.

At S200, a block of semiconductor material is provided. The block of semiconductor material comprises opposite first and second surfaces and a side surface encircling the semiconductor block. In some embodiments, the semiconductor block is a silicon block. In some other embodiments, the semiconductor block is different from silicon and is made of a material that may be strengthened in its mechanical stability by at least one of nitrogen and oxygen. The semiconductor block may be formed from a semiconductor ingot by a slicing process, for example a sawing process such as wire sawing.

At S210, at least one of nitrogen and oxygen is introduced into the semiconductor block through the side surface. A lateral distance between the side surface and a center of the semiconductor block includes first and second parts. The first part extends from the side surface to the second part and the second part extends from the first part to the center. An average concentration of the at least one of nitrogen and oxygen in the first part is greater than $5 \times 10^{14}$ cm$^{-3}$ and exceeds the average concentration of the at least one of oxygen and nitrogen in the second part by more than 20% of the average concentration of the at least one of oxygen and nitrogen in the second part.

At S220, the semiconductor block is sliced into semiconductor wafers. The semiconductor wafers may be formed by slicing the semiconductor block, for example by a sawing process such as wire sawing.

In some embodiments, the at least one of nitrogen and oxygen is introduced into the semiconductor block through the side surface by a furnace diffusion process. In some embodiments, the furnace diffusion process is carried out in a nitrogen atmosphere at temperatures larger than 900° C., or even larger than 1000° C. over a period of more than 1 hour. In addition or as an alternative, the furnace diffusion process may also be carried out in an oxygen atmosphere at temperatures larger than 1100° C., or larger than 1150° C., or even larger than 1200° C. over a period of more than 1 hour.

Figure 3:
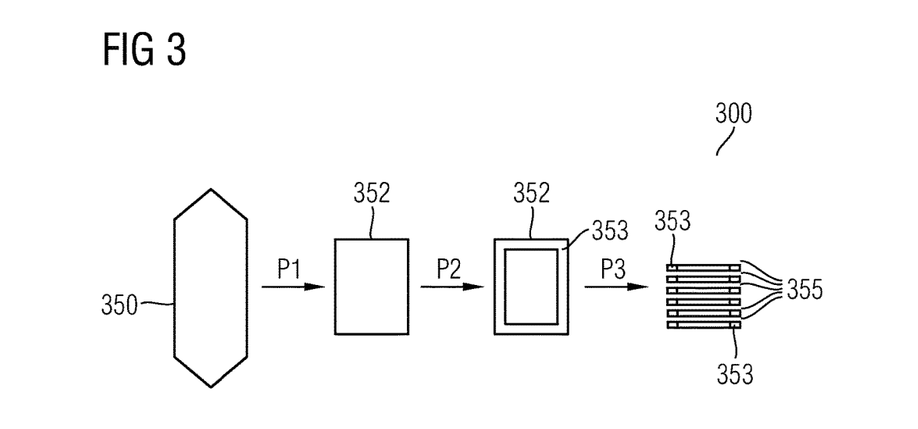
FIG. 3 is a schematic illustration of an embodiment of processing a semiconductor wafer starting from a silicon ingot.

FIG. 3 is a schematic illustration of an exemplary method 300 of manufacturing a silicon wafer.

Starting with a silicon ingot 350, for example manufactured by pulling of a silicon crystal, a silicon block 352 is cut from the silicon ingot 350 at phase P1, for example by a sawing process.

At phase P2, the silicon block 352 is subjected to a furnace process. During the furnace process, nitrogen is diffused through an outer surface of the silicon block 352 into a surface area 353 within a volume of the silicon block 352. The furnace process may be carried out in a nitrogen atmosphere at temperatures greater than 900° C., or even greater than 1000° C. for more than 1 hour. Higher temperatures, for example 1100° C. or 1200° C. or larger, and longer diffusion times, for example 2 hours, 4 hours, 10 hours or longer may be applied depending on a desired concentration of nitrogen in the surface area 353. Alternatively, phase P1 can be omitted which means that the whole silicon ingot 350 is subjected to the furnace process for in-diffusion of nitrogen and/or oxygen.

Then, at phase P3, the silicon block 352 is sliced into silicon wafers 355. Nitrogen introduced into the silicon block 352 at P2 is only present in the surface area 353 encircling an inner part or central part of the silicon wafers 355. In the inner part or central part of the semiconductor wafers 355, a concentration of nitrogen equals the concentration set beforehand in the silicon ingot 350. Enrichment of the silicon wafer 355 with nitrogen in the surface area 353 allows for an improved mechanical stability of the silicon wafers 355.

Figure 4:
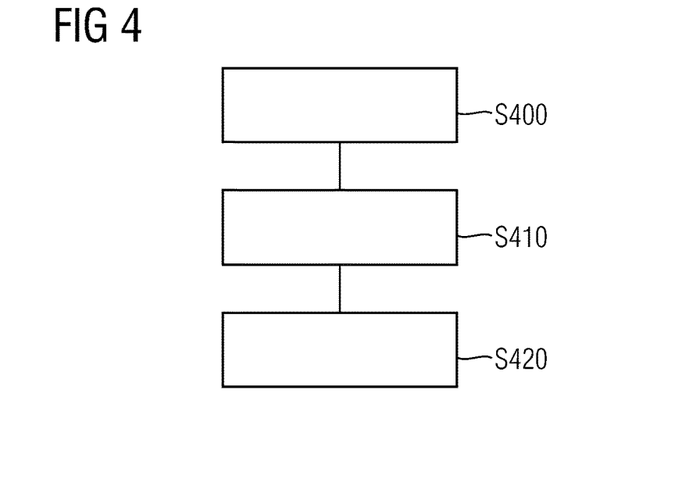
FIG. 4 is a flow diagram of another embodiment of a method of processing a semiconductor wafer.

FIG. 4 is a flow diagram of an embodiment of a method 400 of manufacturing a semiconductor wafer.

It will be appreciated that while method 400 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or faces.

At S400, a semiconductor wafer is formed by slicing a semiconductor block, for example by a sawing process.

At S410, a diffusion barrier is formed on at least one of opposite first and second main surfaces of the semiconductor wafer, the diffusion barrier covering a central part of the semiconductor wafer on the first and second surfaces and leaving an edge part of the semiconductor wafer at the at least one of the first and second surfaces uncovered. In some embodiments, the diffusion barrier is formed by completely covering the semiconductor wafer with a diffusion barrier material, for example by a thermal oxidation process, and partly removing the diffusion barrier material. In some embodiments, the diffusion barrier is formed on one of the first and second main surfaces of the semiconductor wafer, for example on a front side surface of the semiconductor wafer where planar or gate trench electrodes may be formed during FEOL processing. Oxygen entering the silicon wafer from a back or rear side may further increase the stability against generation of slip lines without interfering with a field stop doping. Since semiconductor material at the back or rear side may be removed prior to a field stop ion implantation process, oxygen entering the silicon wafer at the back side may only lead to thermal donors in negligible quantities. Optionally, an oxygen diffusion barrier, for example a oxide/nitride layer stack may be formed on a surface part of the silicon wafer where dies may be implemented later by FEOL processing, and thus, oxygen in-diffusion only takes place in an area close of the silicon wafer close to the wafer edge. In case both of the first and second main surfaces of the semiconductor wafer undergo FEOL processing without removal of semiconductor material from one of the first and second main surfaces, the diffusion barrier may be formed on both of the opposite first and second main surfaces of the semiconductor wafer.

At S420, at least one of nitrogen and oxygen is introduced into the semiconductor wafer through an uncovered part of the semiconductor wafer, for example by a diffusion and/or ion implantation process.

a. In some embodiments, the semiconductor wafer is a silicon wafer. In some other embodiments, the semiconductor wafer is different from silicon and is made of a material that may be strengthened in its mechanical stability by at least one of nitrogen and oxygen.

In some embodiments, the diffusion barrier is formed as a single layer or a layer stack of oxide and nitride.

In some embodiments, a maximum lateral dimension between a side surface of the semiconductor wafer and the diffusion barrier part ranges between 1 mm and 1 cm.

In some embodiments, the at least one of nitrogen and oxygen is introduced into the semiconductor wafer by a furnace diffusion process. The furnace diffusion process may be carried out in a nitrogen atmosphere at temperatures larger than 900° C., or larger than 1000° C., or even larger than 1100° C. over a period of more than 1 hour, or more than 5 hours, or even more than 20 hours. In addition or as an alternative, the furnace diffusion process is carried out in an oxygen atmosphere at temperatures larger than 1100° C., or even larger 1200° C. over a period of more than 1 hour, or more than 5 hours, or even more than 20 hours.

Figure 5:
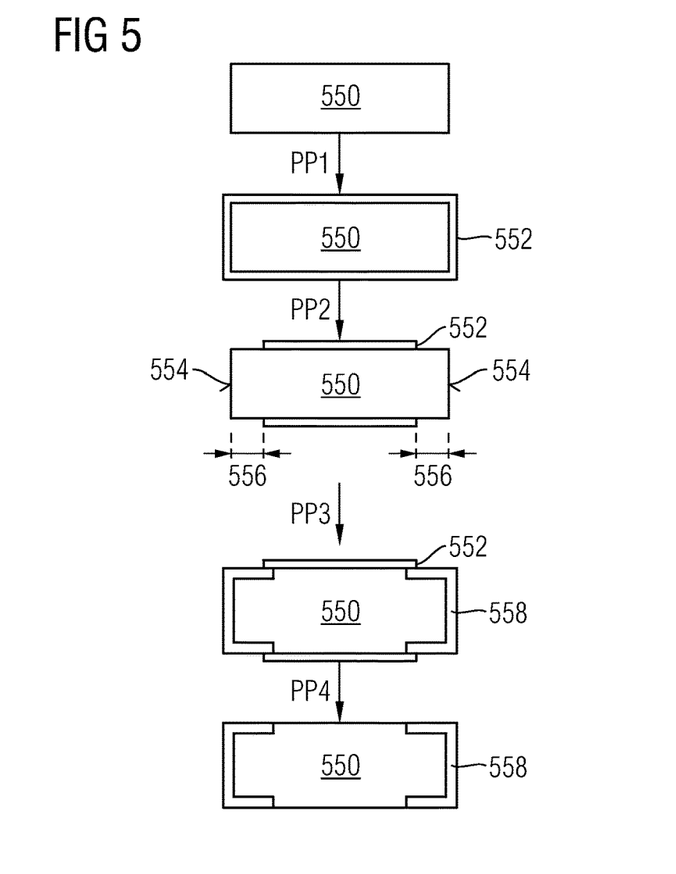
FIG. 5 is a schematic illustration of an embodiment of introducing at least one of nitrogen and oxygen into a semiconductor wafer.

FIG. 5 is a schematic illustration of an exemplary method of manufacturing a silicon wafer.

Starting with a silicon wafer 550, for example manufactured by slicing of a silicon block, a diffusion barrier material 552 is formed on a surface of the silicon wafer 550 at phase PP1, for example by growth on the silicon wafer by thermal oxidation.

At phase PP2, a part of the diffusion barrier material 552 is removed from a side surface 554 and from an edge area 556 of the silicon wafer 550, thereby exposing the silicon wafer at the side surface 554 and at opposite main surfaces in the edge area 556.

At phase PP3, nitrogen is introduced into an unmasked surface area 558 of the silicon wafer 550 through a side surface 554 and through opposite main surfaces in the edge area 556, for example by a diffusion and/or ion implantation process. In some embodiments, diffusion is carried out in a furnace diffusion process in a nitrogen atmosphere at temperatures larger than 900° C., or even larger than 1000° C. over a period of more than 1 hour, or more than 2 hours, or even more than 5 or 10 hours. In some embodiments, the silicon wafer 550 has an oxygen concentration of less than $2.5 \times 10^{17}$ cm$^{-3}$, or even less than $2.0 \times 10^{17}$ cm$^{-3}$ to avoid thermal donor formation and interference with field stop zones manufactured by a proton irradiation process. In some embodiments, the silicon wafer 550 has a nitrogen concentration of less than $10^{15}$ cm$^{-3}$, or even less than $3 \times 10^{14}$ cm$^{-3}$ to avoid interference with field stop zones manufactured by a proton irradiation process. Optionally, additionally or alternatively a furnace diffusion process at temperatures greater than 1100° C., or greater than 1150° C., or even greater than 1200° C. may be carried out in an oxygen atmosphere, for example prior to a front side polishing process. This may result in oxygen diffusing through an overall surface into the silicon wafer 550. Most of the oxygen introduced through the front side will be removed by the front side thinning/polishing process. Optionally, a barrier layer, for example an oxide/nitride layer stack acting as a diffusion barrier against oxygen diffusion may be formed on the front side, for example by layer deposition. The front side may be one of opposite main surfaces of the silicon wafer 550 where planar or gate trench electrodes may be formed during FEOL processing. Oxygen entering the silicon wafer from a back side may further increase the stability against generation of slip lines without interfering with a field stop doping. Since semiconductor material at the back side may be removed prior to a field stop ion implantation process, oxygen entering the silicon wafer 550 at the back side may only lead to thermal donors in negligible quantities. Optionally, an oxygen diffusion barrier, for example a oxide/nitride layer stack may be formed on a surface part of the silicon wafer 550 where dies may be implemented later by FEOL processing, and thus, oxygen in-diffusion only takes place in an area close of the silicon wafer 550 close to the wafer edge.

At phase PP4, diffusion barrier material 552 is removed, for example by mechanical and/or chemical processes such as etching and polishing.

Front-end-of-line (FEOL) processing may follow at the main surfaces of the silicon wafer 550 for manufacturing dies including discrete semiconductor devices and/or integrated circuits.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer, comprising:
    first and second main surfaces opposite to each other along a vertical direction;
    a side surface encircling the semiconductor wafer; and
    a lateral distance, perpendicular to the vertical direction, between the side surface and a center of the semiconductor wafer including first and second parts, the first part extending from the side surface to the second part and the second part extending from the first part to the center, and wherein
    an average concentration of nitrogen in the first part is greater than $5 \times 10^{14}$ atoms/cm$^3$ and exceeds an average concentration of nitrogen in the second part by more than 20% of the average concentration in the second part.

2. The semiconductor wafer of claim 1, wherein the semiconductor wafer is a Czochralski silicon wafer or a Float Zone silicon wafer.

3. The semiconductor wafer of claim 1, wherein a lateral dimension of the first part between the side surface and the second part ranges between 10 μm and 1 cm.

4. The semiconductor wafer of claim 1, wherein a concentration of nitrogen decreases along more than 80% of a lateral dimension of the first part starting from the side surface.

5. The semiconductor wafer of claim 4, wherein a profile of concentration of nitrogen equals a diffusion profile of dopants entering the semiconductor wafer through the side surface.

6. The semiconductor wafer of claim 1, wherein a profile of concentration of nitrogen along the lateral distance is a step-concentration profile including a decrease of concentration at an interface between the first part and the second part.

7. The semiconductor wafer of claim 1, wherein an average concentration of nitrogen in an edge part of the semiconductor wafer exceeds an average concentration of nitrogen in a central part encircled by the edge part by more than 20% of the average concentration of nitrogen in the central part.

8. The semiconductor wafer of claim 7, wherein a maximum lateral dimension of the edge part between the side surface and the central part ranges between 10 μm and 1 cm.

9. The semiconductor wafer of claim 1, wherein the semiconductor wafer is a 12 inch semiconductor wafer or larger.

10. The semiconductor wafer of claim 1, wherein the average concentration of is more than 10 times greater in the first part than in the second part.

11. A method of manufacturing a semiconductor wafer, the method comprising:
    providing a block of semiconductor material, the block of semiconductor material comprising opposite first and second surfaces and a side surface encircling the semiconductor block;
    introducing at least one of nitrogen and oxygen into the semiconductor block through the side surface, wherein a lateral distance between the side surface and a center of the semiconductor block includes first and second parts, the first part extending from the side surface to the second part and the second part extending from the first part to the center, and wherein an average concentration of the at least one of nitrogen and oxygen in the first part is greater than $5 \times 10^{14}$ atoms cm$^{-3}$ and exceeds the average concentration of the at least one of nitrogen and oxygen in the second part by more than 20% of the average concentration of the at least one of nitrogen and oxygen in the second part; and
    slicing the semiconductor block into semiconductor wafers.

12. The method of claim 11, wherein the at least one of nitrogen and oxygen is introduced into the semiconductor block through the side surface by a furnace diffusion process.

13. The method of claim 12, wherein the furnace diffusion process is carried out in a nitrogen atmosphere at temperatures larger than 1000° C. over a period of more than 1 hour.

14. The method of claim 12, wherein the furnace diffusion process is carried out in an oxygen atmosphere at temperatures larger than 1100° C. over a period of more than 1 hour.

* * * * *